US012813041B2

(12) United States Patent
Huang et al.

(10) Patent No.: US 12,813,041 B2
(45) Date of Patent: Nov. 24, 2026

(54) DISPLAY DEVICE AND MANUFACTURING METHOD THEREOF

(71) Applicant: AUO Corporation, Hsinchu (TW)

(72) Inventors: Ching-Liang Huang, Hsinchu (TW); Chun-Hsiang Chan, Hsinchu (TW); Ting-Wei Tsai, Hsinchu (TW); Sheng-Ming Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 322 days.

(21) Appl. No.: 18/735,200

(22) Filed: Jun. 6, 2024

(65) Prior Publication Data

US 2025/0081694 A1 Mar. 6, 2025

(30) Foreign Application Priority Data

Aug. 29, 2023 (TW) ................................ 112132616

(51) Int. Cl.
*H10H 20/856* (2025.01)
*H10H 20/01* (2025.01)
*H10W 90/00* (2026.01)

(52) U.S. Cl.
CPC .......... *H10H 20/856* (2025.01); *H10W 90/00* (2026.01); *H10H 20/0363* (2025.01)

(58) Field of Classification Search
CPC ........... H10H 20/0361; H10H 20/8513; H10H 20/855; H10H 20/856; H10H 20/0363; H10H 20/8316; H10H 20/01; H10H 20/8514; H10H 20/857; H10H 29/142; H10H 20/018; H10H 20/032; H10H 20/0364; H10H 20/819; H10H 20/8515; H10H 20/882; B41J 2/1623; B41J 2/1631; B41J 2/1628; B41J 2/1632; B41J 2/1643; B41J 2/1625; B41J 2/1629; B41J 2/14233; B41J 2/1646; B41J 2/161; B41J 2/14; B41J 2/1433; B41J 2002/14491; B41J 2202/11; B41J 2002/14266; B41J 2002/14475
See application file for complete search history.

(56) References Cited

U.S. PATENT DOCUMENTS 10,748,879 B2 8/2020 Iguchi et al.
11,264,365 B2 3/2022 Iguchi et al.
(Continued)

FOREIGN PATENT DOCUMENTS

CN 109256455 1/2019
CN 110211986 9/2019
(Continued)

*Primary Examiner* — Mouloucoulaye Inoussa
(74) *Attorney, Agent, or Firm* — JCIPRNET

(57) ABSTRACT

A display device includes a substrate, a reflective structure, and a pixel unit. The pixel unit is disposed on the substrate. The pixel unit includes a sub-pixel. The sub-pixel includes a light-emitting element. A light emitted by the light-emitting element has a color. The reflective structure is disposed on the substrate. The reflective structure includes a first portion and a second portion. The first portion of the reflective structure surrounds the light-emitting element. A projection area of the first portion of the reflective structure on the substrate is less than a projection area of the second portion of the reflective structure on the substrate.

20 Claims, 6 Drawing Sheets

(56) References Cited

U.S. PATENT DOCUMENTS

| | | | | |
|---|---|---|---|---|
| 2013/0057143 | A1* | 3/2013 | Sugimoto | H10K 59/122 313/498 |
| 2019/0267357 | A1 | 8/2019 | Iguchi et al. | |
| 2020/0343229 | A1 | 10/2020 | Iguchi et al. | |
| 2022/0227134 | A1* | 7/2022 | Eguchi | B41J 2/1623 |
| 2022/0352241 | A1* | 11/2022 | Jeon | H10H 29/142 |
| 2022/0406975 | A1* | 12/2022 | Lee | G06F 1/1652 |
| 2023/0005899 | A1* | 1/2023 | Kim | H10H 20/856 |
| 2023/0064695 | A1* | 3/2023 | Jeon | H10H 20/8316 |
| 2023/0172004 | A1* | 6/2023 | Song | H10K 59/122 257/40 |
| 2023/0197763 | A1* | 6/2023 | Shin | H10H 20/819 257/89 |
| 2023/0200139 | A1* | 6/2023 | Chei | H10K 59/122 257/40 |
| 2023/0215856 | A1 | 7/2023 | Kim et al. | |
| 2024/0038943 | A1* | 2/2024 | Kim | H10H 20/8312 |

FOREIGN PATENT DOCUMENTS

| | | |
|---|---|---|
| CN | 113871548 | 12/2021 |
| CN | 115274740 | 11/2022 |
| CN | 115347015 | 11/2022 |
| CN | 116404086 | 7/2023 |
| TW | M634809 | 12/2022 |
| TW | 202318657 | 5/2023 |

* cited by examiner

DISPLAY DEVICE AND MANUFACTURING METHOD THEREOF

CROSS-REFERENCE TO RELATED APPLICATION

This application claims the priority benefit of Taiwan application serial no. 112132616, filed on Aug. 29, 2023. The entirety of the above-mentioned patent application is hereby incorporated by reference herein and made a part of this specification.

BACKGROUND

Technical Field

The disclosure relates to a display device and a manufacturing method thereof.

Description of Related Art

A light-emitting element in a display device, such as a light emitting diode (LED), may drive a light-emitting layer of the light emitting diode by an electron current to emit a light. At present, the light emitting diode still faces many technical challenges, and an efficiency droop effect of the light emitting diodes is one of the technical challenges. Specifically, when the light emitting diode is in an operating range of a current density, it will correspond to a peak value of external quantum efficiency (EQE). As the current density of the light emitting diode continues to increase, the external quantum efficiency will decrease, and this phenomenon is the efficiency droop effect of the light emitting diode.

Currently, procedures such as etching process and isolation are used when manufacturing micro light emitting diodes (micro LED). However, during the etching process, damage to a sidewall of the micro LEDs may be caused, which affects the micro LEDs to generate non-radiative recombination when emitting the light, resulting in a significant decrease in the external quantum efficiency (EQE). When a size of the micro LED is less than 50 microns, since a surface area of a sidewall surface accounts for a larger proportion of a surface area of an overall epitaxial structure, a proportion of carriers flowing through the sidewall will also increase, resulting in a significant decrease in the external quantum efficiency.

SUMMARY

The disclosure provides a display device and a manufacturing method thereof, which may improve external quantum efficiency (EQE) and have better light-emitting efficiency.

The disclosure provides a display device including a substrate, a reflective structure, and a pixel unit. The pixel unit is disposed on the substrate. The pixel unit includes a sub-pixel. The sub-pixel includes a light-emitting element. A light emitted by the light-emitting element has a color. The reflective structure is disposed on the substrate. The reflective structure includes a first portion and a second portion. The first portion of the reflective structure surrounds the light-emitting element, and an area of the first portion projected on the substrate is less than an area of the second portion projected on the substrate.

The disclosure provides a manufacturing method of a display device including the following. A substrate is provided. A pixel unit is disposed on the substrate to be electrically connected to the substrate. The pixel unit includes a sub-pixel. The sub-pixel includes a light-emitting element, and a light emitted by the light-emitting element has a color. A reflective structure is formed on the substrate through an electroplating process. The reflective structure includes a first portion and a second portion. The first portion of the reflective structure surrounds the light-emitting element, and an area of the first portion projected on the substrate is less than an area of the second portion projected on the substrate.

Based on the above, in the display device and the manufacturing method thereof according to the embodiment of the disclosure, the pixel unit and the reflective structure are disposed on the substrate. The pixel unit includes the sub-pixel, and the sub-pixel includes the light-emitting element. The reflective structure includes the first portion and the second portion, and the projection area of the first portion on the substrate is less than the projection area of the second portion on the substrate. When the light-emitting element emits the light, since the first portion of the reflective structure surrounds the light-emitting element, it helps to improve an issue of poor electrical transmission and light-emitting efficiency of the light-emitting element.

DETAILED DESCRIPTION OF DISCLOSED EMBODIMENTS

Figure 1:
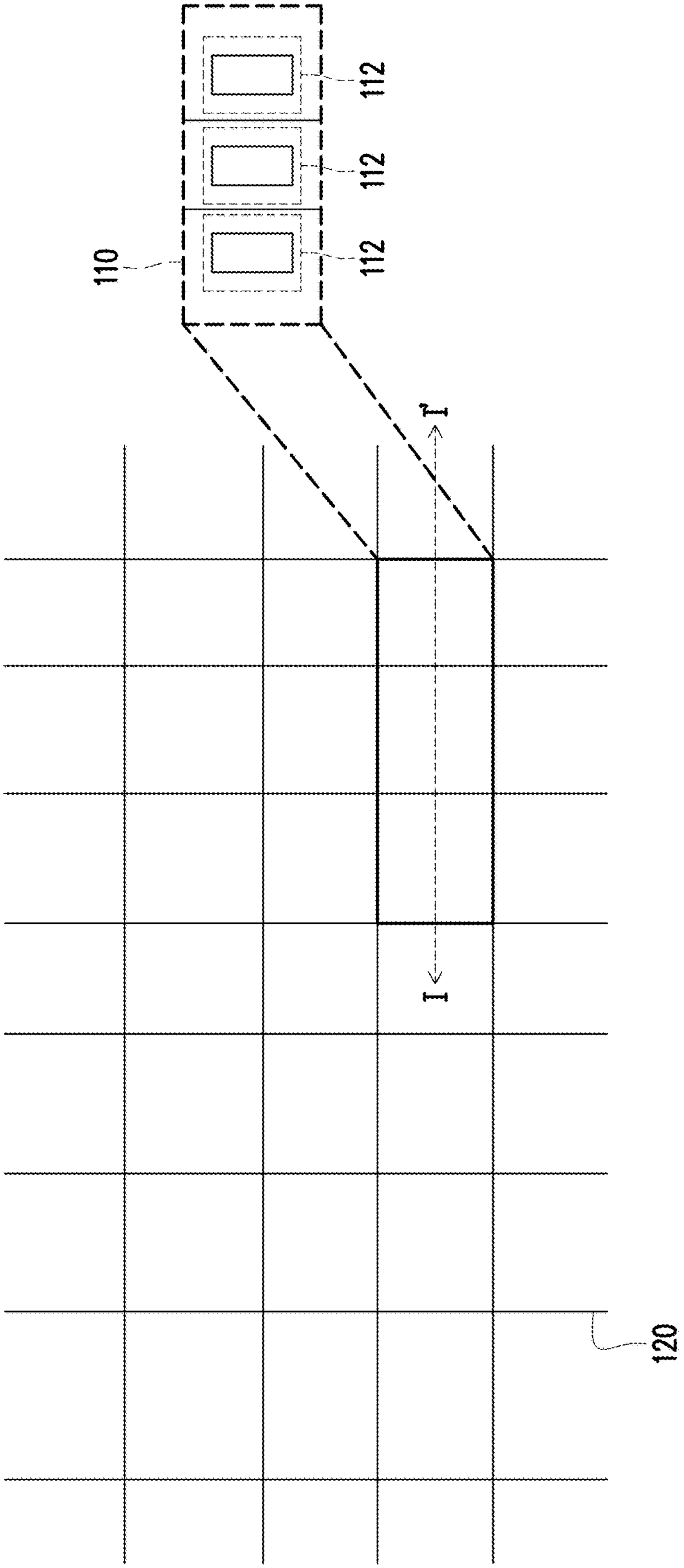
FIG. 1 is a schematic top view of a display device according to an embodiment of the disclosure.
Figure 2:
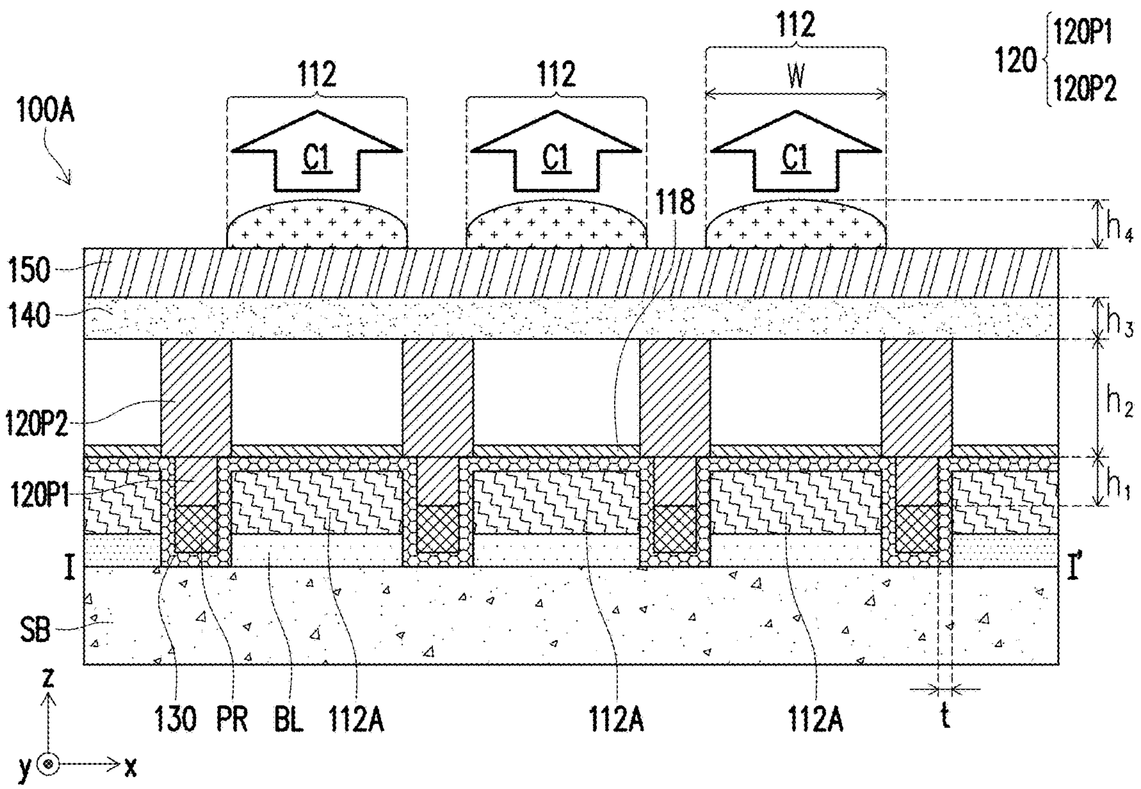
FIG. 2 is a schematic cross-sectional view of a display device according to an embodiment of the disclosure.
Figure 5A:
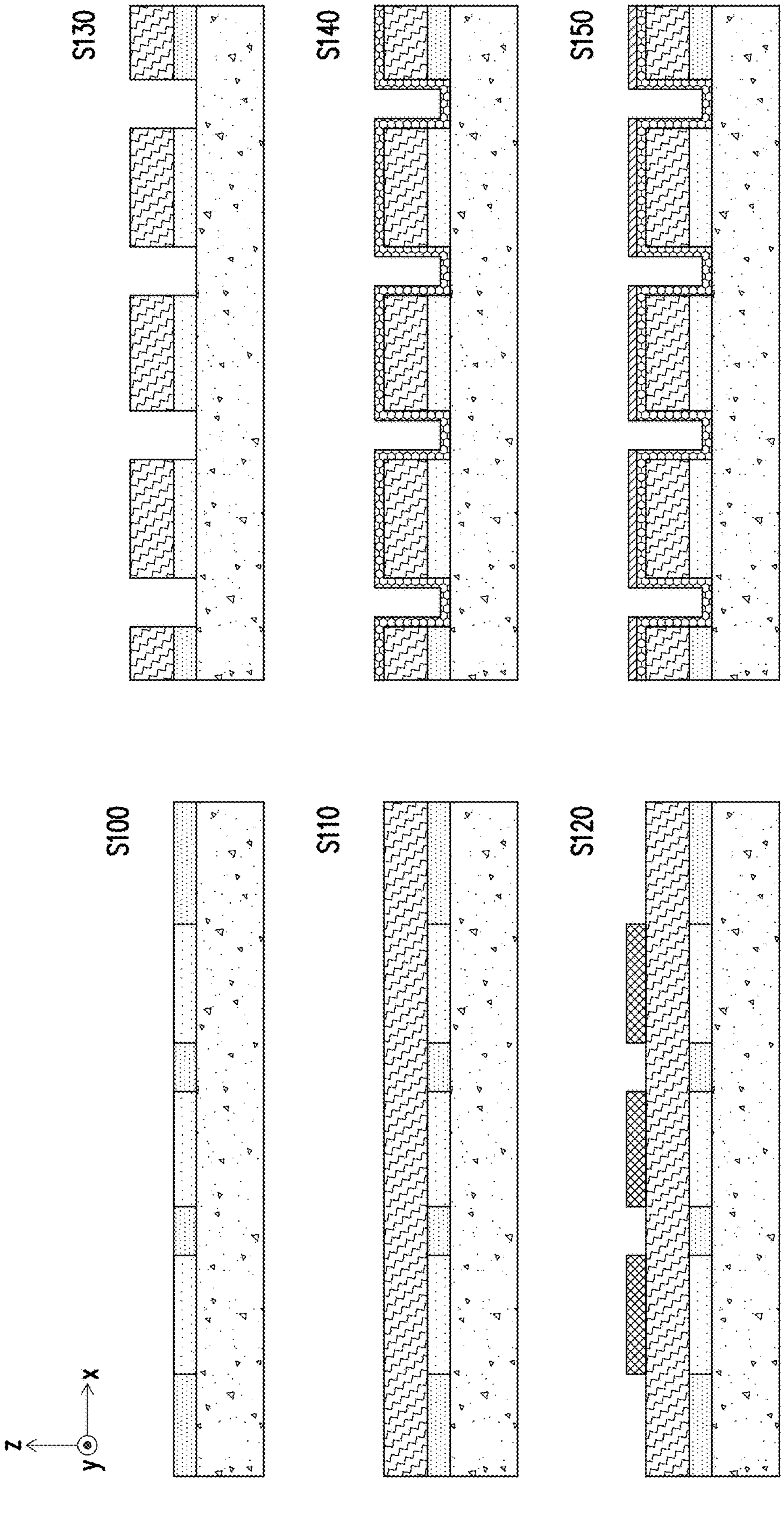
FIGS. 5A to 5C are schematic cross-sectional views of a manufacturing method of a display device according to an embodiment of the disclosure.
Figure 5B:
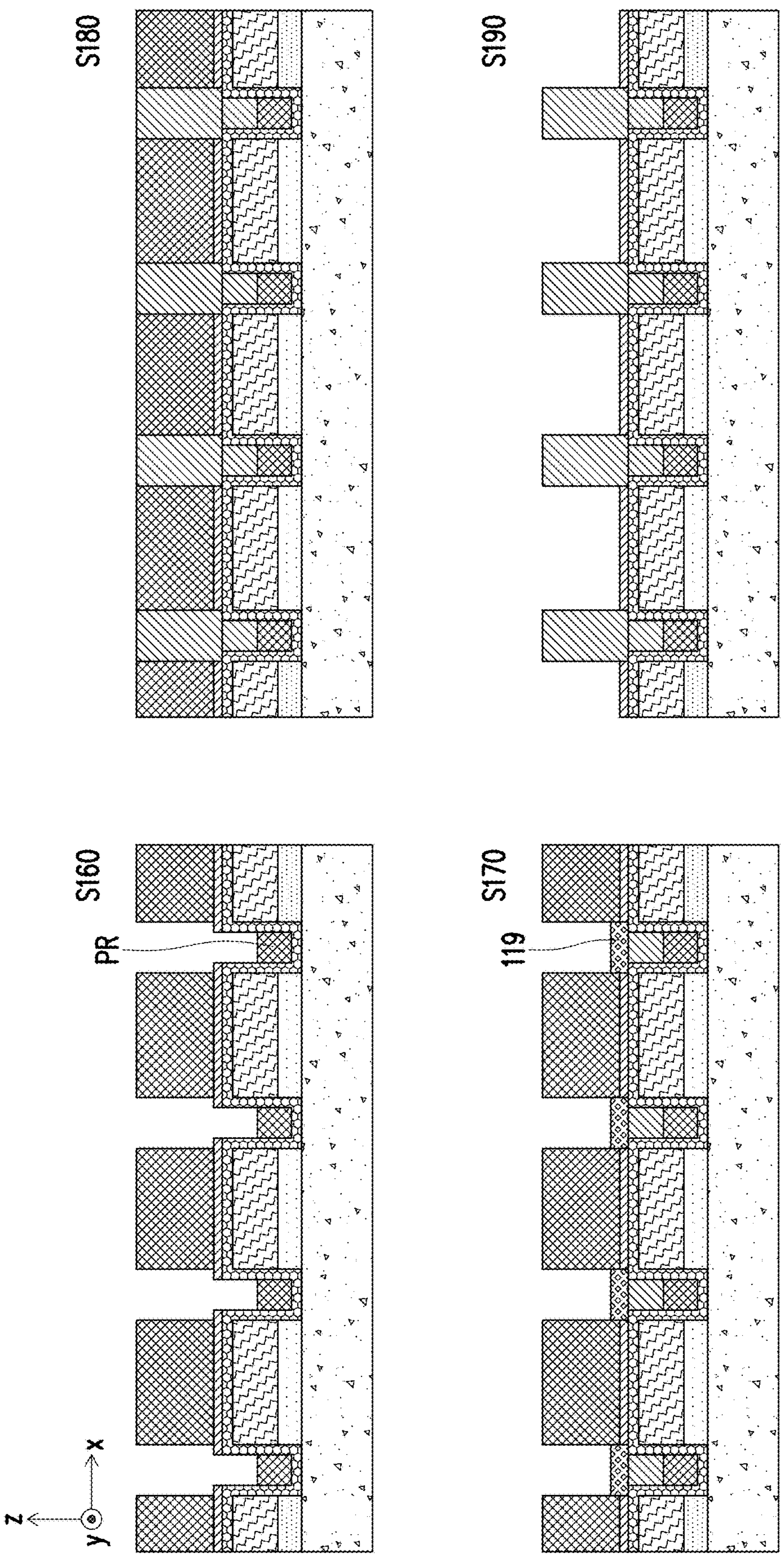
Figure 5C:
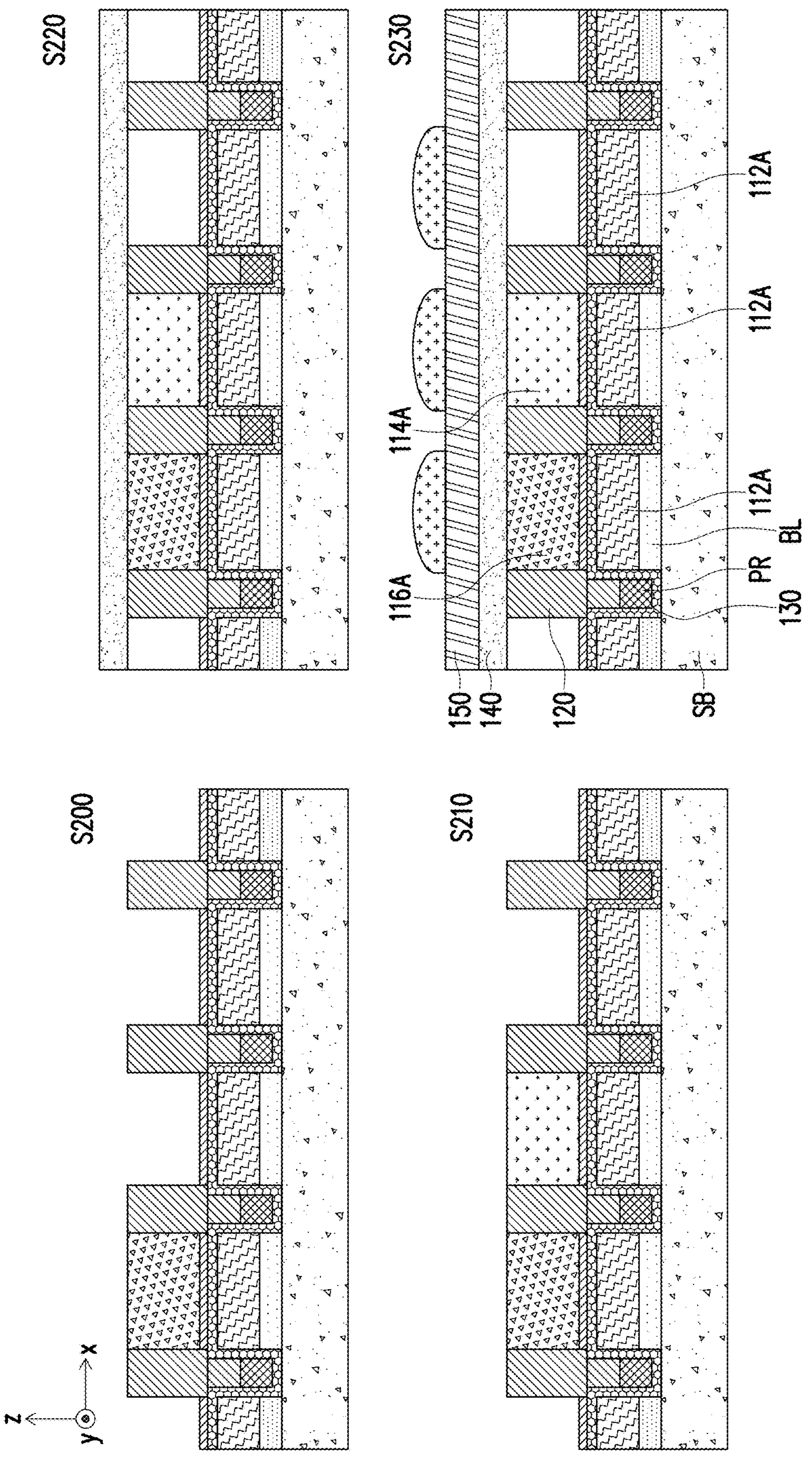

FIG. 1 is a schematic top view of a display device according to an embodiment of the disclosure. FIG. 2 is a schematic cross-sectional view of a display device according to an embodiment of the disclosure. FIG. 2 corresponds to a position of a line I-I' in FIG. 1. FIGS. 5A to 5C are schematic cross-sectional views of a manufacturing method of a display device according to an embodiment of the disclosure.

Referring to FIGS. 1, 2, and 5A to 5C together, a display device 100A includes a substrate SB and a pixel unit 110. The pixel units 110 are located on the substrate SB and are arranged in an array. The pixel unit 110 includes sub-pixels 112 adjacent to each other. In this embodiment, each of the pixel units 110 may, for example, include three sub-pixels for description, but the disclosure is not limited thereto. In some embodiments, the pixel unit 110 may include two sub-pixels, four sub-pixels, or other numbers of sub-pixels.

In this embodiment, the sub-pixels 112 are disposed adjacent to each other. However, in other embodiments, a layout arrangement in which other sub-pixels are disposed between the sub-pixels 112 is not excluded. The sub-pixel 112 includes a light-emitting element 112A. The light-emitting element 112A may be a light emitting diode (LED), a mini light emitting diode (mini LED), a micro light emitting diode (μLED), an organic light emitting diode (OLED), any element that may emit a light, etc.

The substrate SB may be a complementary metal-oxide semiconductor (CMOS) substrate or a substrate formed by a combination including elements (boron, aluminum, gallium, indium, thallium, nihonium) from a group III on periodic table and elements (nitrogen, phosphorus, arsenic, antimony, bismuth, moscovium) from the fifth group on the periodic table, but the disclosure is not limited thereto.

The light-emitting element 112A emits a light with a color C1. The light with the color C1 is, for example, a short-wavelength light, and the short-wavelength light is, for example, an ultraviolet light (a wavelength range is about 1 nm to 380 nm), a violet light (a wavelength range is about 380 nm to 450 nm), or a blue light (a wavelength range is about 450 nm to 495 nm). In this embodiment, the light-emitting element 112A emits the light directly to present a color of the sub-pixel 112, but the disclosure is not limited thereto.

In step S100, a conductive connection layer BL is formed on the substrate SB. In step S110, a light-emitting layer (e.g., a light emitting diode layer or an organic light emitting diode layer) is formed on the conductive connection layer BL. The light-emitting layer on the conductive connection layer BL may be etched (referring to step S130) through a patterned mask (referring to step S120) to form the light-emitting elements 112A arranged in an array. An etching technology may be, for example, an inductively coupled plasma (ICP) etching technology. In some embodiments, the light-emitting element may also be electrically connected to the substrate SB through welding, a conductive adhesive, or other methods.

In step S140, a film layer 130 covering the light-emitting element 112A, the conductive connection layer BL, and the substrate SB is formed on the substrate SB. A thickness t of the film layer 130 falls in a range of greater than 200 nanometers and 500 nanometers. The film layer 130 may be, for example, a planarization layer (PL), a back channel passivation layer (BP layer), or a buffer layer, but the disclosure is not limited thereto.

In step S150, an electrode layer 118 is formed on the light-emitting element 112A. A portion of the film layer 130 is located between the electrode layer 118 and the light-emitting element 112A. A material of the electrode layer 118 may be, for example, indium tin oxide (ITO).

In step S160, a photoresist PR is filled between the adjacent light-emitting elements 112A through the patterned mask. In step S170, a first portion 120P1 of a reflective structure 120 is formed between the adjacent light-emitting elements 112A and is located on the photoresist PR by using an electroplating technology. A seed layer 119 is formed on the first portion 120P1 of the reflective structure 120. The seed layer 119 has a height in a Z direction, and the height falls in a range less than 1 micron.

In step S180, a second portion 120P2 of the reflective structure 120 is formed on the seed layer 119 by using the electroplating technology. The second portion 120P2 of the reflective structure 120 is in contact with the electrode layer 118, while the first portion 120P1 of the reflective structure 120 is not in contact with the electrode layer 118.

Since the reflective structure 120 is formed between the adjacent light-emitting elements 112A and surrounds the light-emitting device element, it helps to improve electrical transmission of the light-emitting element 112A and light-emitting efficiency of the light-emitting element.

The reflective structure 120 may be, for example, a metal reflective material. A metal material may include aluminum, silver, gold, copper, or other metal with high reflectivity, but the disclosure is not limited thereto.

In this embodiment, a sidewall of the reflective structure 120 has a staircase structure. A projection area of the first portion 120P1 of the reflective structure 120 on the substrate SB is less than a projection area of the second portion 120P2 on the substrate SB.

The reflective structure 120 surrounds the light-emitting element 112A, and the first portion 120P1 of the reflective structure 120 partially overlaps the light-emitting element 112A in an X direction. The first portion 120P1 of the reflective structure 120 has a height h1 in the Z direction, and the height h1 falls in a range of greater than 5 microns and less than 12 microns.

In step S190, the patterned mask in step S160 is removed. In this embodiment, a film layer 140 may be directly formed on the reflective structure 120 (referring to step S220). The film layer 140 may be, for example, a planarization layer (PL), a capping layer (CL), or a barrier layer, but the disclosure is not limited thereto.

The film layer 140 has a height h3 in the Z direction, and the height h3 falls in a range of greater than 1 micron and less than 3 microns.

In step S230, a lens layer 150 is formed on the film layer 140. The lens layer 150 has multiple lenses arranged along the X direction. A projection of the lens of the lens layer on the substrate SB overlaps a projection of the light-emitting element 112A on the substrate SB. Therefore, the lens in the lens layer overlaps the light-emitting element 112A in the Z direction.

Any one of the lenses on the lens layer has a width W along the X direction and a height h4 along the Z direction. The height h4 falls in a range of greater than 1 micron and less than 4 microns. A ratio of the width W to the height h4 falls in a range of greater than 0.4 and less than 0.7.

The light-emitting element 112A emits the light with the color C1, and the lens on the lens layer 150 focuses the color C1, which helps to improve the light-emitting efficiency of the light-emitting element 112A.

Figure 3:
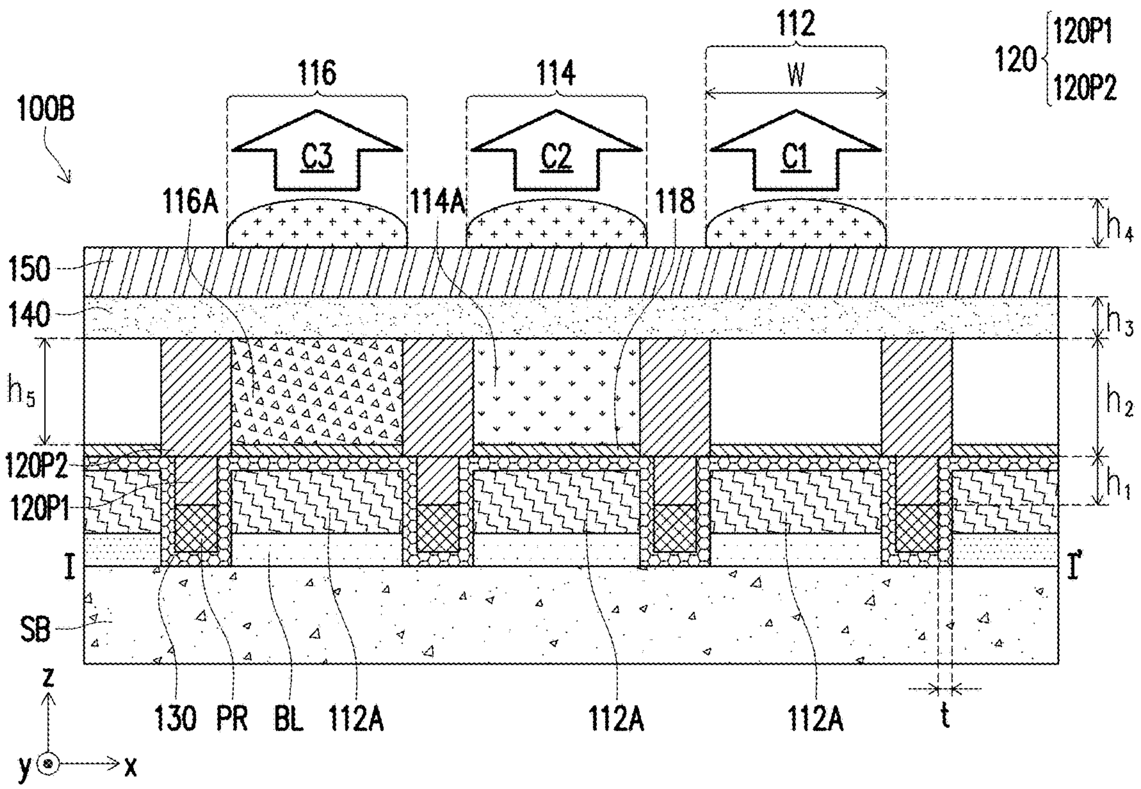
FIG. 3 is a schematic cross-sectional view of a display device according to another embodiment of the disclosure.

FIG. 3 is a schematic cross-sectional view of a display device according to another embodiment of the disclosure. FIG. 3 corresponds to the position of the line I-I' in FIG. 1.

Referring to FIGS. 3 and 5A to 5C together, a difference between a display device 100B and the display device 100A is that the pixel unit 110 of the display device 100B further includes a sub-pixel 114 and a sub-pixel 116. The sub-pixel 112, the sub-pixel 114, and the sub-pixel 116 are disposed adjacently to each other. For example, the sub-pixel 116 may be adjacent to the sub-pixel 112, or the sub-pixel 116 may be adjacent to the sub-pixel 114. In other words, the sub-pixel 116 is adjacent to at least one of the sub-pixel 112 or the sub-pixel 114.

In step S200, the sub-pixel 116 includes a color conversion structure 116A. The color conversion structure may be a quantum dot color conversion structure or a polymer color conversion structure.

The color conversion structure 116A may absorb the short-wavelength light to be converted into a long-wavelength light at the same time. For example, the color conversion structure 116A may absorb the short-wavelength ultraviolet light (the wavelength range is about 1 nm to 380 nm), violet light (the wavelength range is about 380 nm to 450 nm), and blue light (the wavelength range is about 450 nm to 495 nm), and to be converted into a long-wavelength red light (a wavelength range is about 620 nm to 750 nm), yellow light (a wavelength range is about 570 nm to 590 nm), green light (a wavelength range is about 495 nm to 570 nm), etc. at the same time. The color conversion structure 116A is disposed on the light-emitting element 112A, and is used to absorb and convert the light emitted by the light-emitting element 112A. As a result, the light emitted by the light-emitting element 112A is the short-wavelength light that may be absorbed by the color conversion structure 116A, such as the blue light, the ultraviolet light, or a deep ultraviolet light.

The light with the color C1 emitted by the light-emitting element 112A is converted by the color conversion structure 116A to present a color of the sub-pixel 116. The light of the sub-pixel 116 is, for example, a light with a color C3. The light with the color C3 is different from the light with the color C1, and a wavelength of the light with the color C3 is greater than that of the light with the color C1. The light with the color C3 is, for example, red, but the disclosure is not limited thereto.

In step S210, the sub-pixel 114 further includes a color conversion structure 114A. The color conversion structure 114A and the color conversion structure 116A have similar functions. The color conversion structure 114A is disposed on the light-emitting element 112A, and is used to absorb and convert the light emitted by the light-emitting element 112A.

The light emitted by the sub-pixel 114 is not emitted directly but is emitted after being converted by the color conversion structure 114A to present a color of the sub-pixel 114. The light of the sub-pixel 114 is, for example, a light with a color C2. The light with the color C2 is different from the light with the color C1, and a wavelength of the light with the color C2 is greater than that of the light with the color C1. The light with the color C2 is, for example, green or yellow, but the disclosure is not limited thereto.

Therefore, the color conversion structure 114A and the color conversion structure 116A may convert the light emitted by the light-emitting element 112A, which helps to improve light-emitting brightness of the color C2 of the sub-pixel 114 and the color C3 of the sub-pixel 116, thereby improving light-emitting efficiency of the sub-pixel 114 and the sub-pixel 116.

The color conversion structure 114A and the color conversion structure 116A have a height h5 along the Z direction, and the height h5 falls in a range of between than 1 micron and less than 3 microns.

The second portion 120P2 of the reflective structure 120 has a height h2 along the Z direction, is formed between the color conversion structure 114A and the color conversion structure 116A adjacent to each other, and surrounds the color conversion structure 114A and the color conversion structure 116A, which helps to improve the light-emitting efficiency of the sub-pixel 114 and the sub-pixel 116.

In this embodiment, the sub-pixel 112, the sub-pixel 114, and the sub-pixel 116 are used to present the color C1, the color C2, and the color C3 respectively. In some embodiments, the color C1, the color C2, and the color C3 may be blue, green, and red respectively, but the disclosure is not limited thereto. For example, the color C1, the color C2, and the color C3 may respectively be three different colors of light in a visible light.

In some embodiments, the display device may optionally further include a color filter pattern corresponding to at least one of the sub-pixel 114 and the sub-pixel 116. The color filter pattern corresponding to the sub-pixel 114 may have the color C2, while the color filter pattern corresponding to the sub-pixel 116 may have the color C3. In other words, each of the sub-pixel may optionally match the appropriate color filter pattern or omit the color filter pattern according to requirements.

Figure 4:
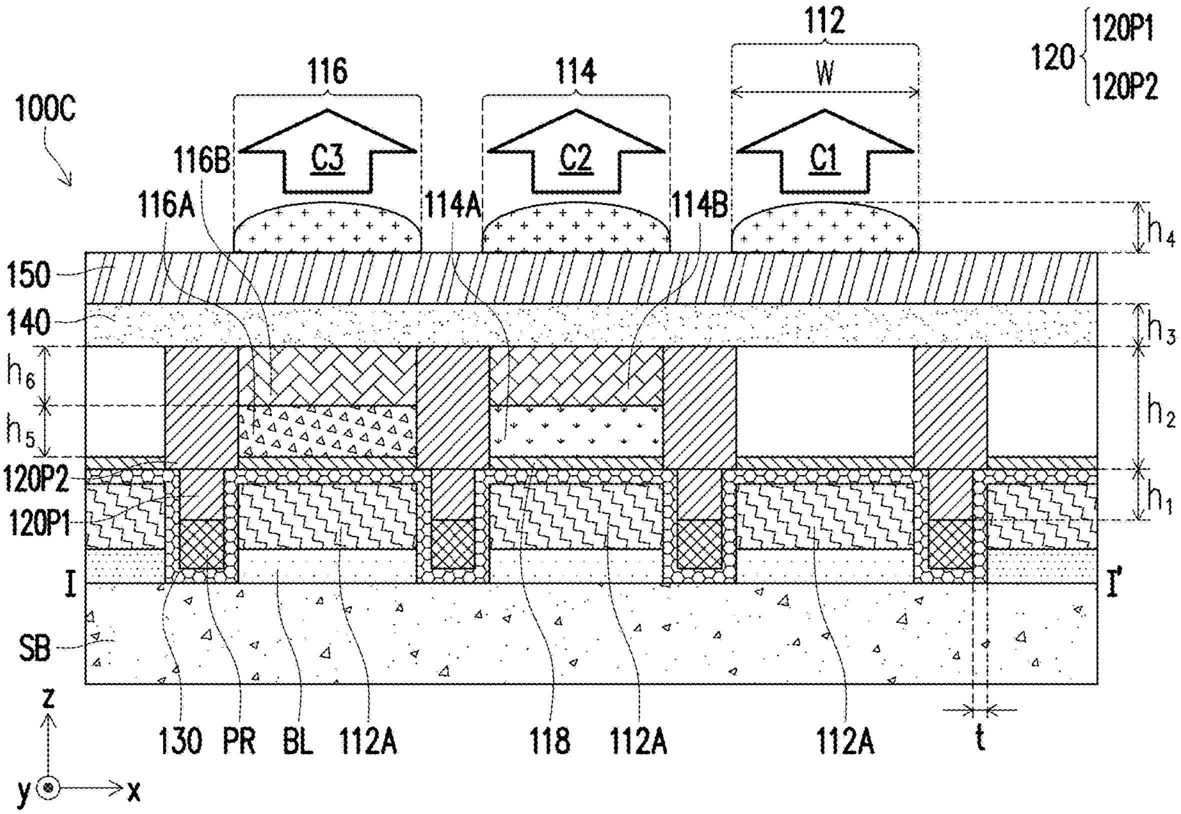
FIG. 4 is a schematic cross-sectional view of a display device according to another embodiment of the disclosure.

FIG. 4 is a schematic cross-sectional view of a display device according to another embodiment of the disclosure.

As shown in FIG. 4, a difference between a display device 100C and the display device 100B is that the pixel unit 110 of the display device 100C further includes a color filter pattern 114B and a color filter pattern 116B. The color filter pattern 114B is disposed on the color conversion structure 114A, and the color filter pattern 116B is disposed on the color conversion structure 116A. The color filter pattern 114B has a filter pattern with the color C2, and the color filter pattern 116B has a filter pattern with the color C3. Therefore, the light may pass through the color filter pattern 114B and the color filter pattern 116B, thereby improving light color purity of the sub-pixel 114 and the sub-pixel 116.

The color filter pattern 114B and the color filter pattern 116B have a height h6 along the Z direction, and the height h6 falls in the range of greater than 1 micron and less than 3 microns.

Based on the above, in the display device of the disclosure, the reflective structure includes the first portion and the second portion. The first portion of the reflective structure surrounds the light-emitting element. When the light-emitting element emits the light, through a design of the reflective structure, it helps to improve the electrical transmission and the light-emitting efficiency of the light-emitting element, thereby increasing the external quantum efficiency (EQE) of the light-emitting element.

What is claimed is:

1. A display device, comprising:

a substrate;

a pixel unit disposed on the substrate, comprising:

a first sub-pixel, comprising:

a first light-emitting element, wherein an emitted light has a first color; and a reflective structure disposed on the substrate and comprising a first portion and a second portion, wherein the first portion of the reflective structure surrounds the first light-emitting element, and a projection area of the first portion on the substrate is less than a projection area of the second portion on the substrate; and an electrode layer formed on the first light-emitting element, wherein the electrode layer has a through hole, and a part of the second portion of the reflective structure is disposed in the through hole of the electrode layer.

2. The display device according to claim 1, wherein the first portion of the reflective structure has a first height along a first direction, and the first height falls in a range of greater than 5 microns and less than 12 microns.

3. The display device according to claim 1, wherein the pixel unit further comprises a first color conversion structure disposed on the first light-emitting element and adapted to convert the light emitted by the first light-emitting element into a second color, and the second portion of the reflective structure surrounds the first color conversion structure.

4. The display device according to claim 3, wherein the first color conversion structure has a second height along a first direction, and the second height falls in a range of greater than 1 micron and less than 3 microns.

5. The display device according to claim 3, further comprising a first color filter pattern disposed on the first color conversion structure, wherein the first color filter pattern has a filter pattern with the second color.

6. The display device according to claim 5, wherein the first color filter pattern has a third height along a first direction, and the third height falls in a range of greater than 1 micron and less than 3 microns.

7. The display device according to claim 1, wherein the pixel unit further comprises a second sub-pixel area, the second sub-pixel area comprises a second light-emitting element and a second color conversion structure, and the second color conversion structure is disposed on the second light-emitting element and is adapted to convert a light emitted by the second light-emitting element into a third color.

8. The display device according to claim 7, further comprising a second color filter pattern, disposed on the second color conversion structure, wherein the second color filter pattern has a filter pattern with the third color.

9. The display device according to claim 1, further comprising a lens layer disposed on the substrate, wherein the reflective structure is located between the lens layer and the substrate.

10. The display device according to claim 9, further comprising a first film layer disposed between the lens layer and the reflective structure.

11. The display device according to claim 10, wherein the first film layer has a fourth height along a first direction, and the fourth height falls in a range of greater than 1 micron and less than 3 microns.

12. The display device according to claim 9, wherein the lens layer comprises a plurality of lenses, any one of the lenses has a fifth height along a first direction, any one of the lenses has a first width along a second direction, and a ratio of the first width to the fifth height falls in a range of greater than 0.4 and less than 0.7.

13. The display device according to claim 1, further comprising a second film layer disposed between the first portion of the reflective structure and the first light-emitting element.

14. The display device according to claim 13, wherein the second film layer has a first thickness along a second direction, and the first thickness falls in a range of greater than 200 nanometers and 500 nanometers.

15. A manufacturing method of a display device, comprising:

providing a substrate;

disposing a pixel unit on the substrate to be electrically connected to the substrate, wherein the pixel unit comprises a first sub-pixel, the first sub-pixel comprises a first light-emitting element, and a light emitted by the first light-emitting element has a first color;

forming an electrode layer on the first light-emitting element, wherein the electrode layer has a through hole; and forming a reflective structure on the substrate through an electroplating process, wherein the reflective structure comprises a first portion and a second portion, the first portion of the reflective structure surrounds the first light-emitting element, and an area of the first portion projected on the substrate is less than an area of the second portion projected on the substrate, and a part of the second portion of the reflective structure is disposed in the through hole of the electrode layer.

16. The manufacturing method according to claim 15, further comprising:

forming a first color conversion structure on the first light-emitting element, wherein the first color conversion structure is adapted to convert the light emitted by the first light-emitting element into a second color, and the second portion of the reflective structure surrounds the first color conversion structure.

17. The manufacturing method according to claim 16, further comprising:

forming a first color filter pattern on the first color conversion structure, wherein the first color filter pattern has a filter pattern with the second color.

18. The manufacturing method according to claim 17, further comprising:

forming a lens layer on the substrate, wherein the reflective structure is located between the lens layer and the substrate.

19. The manufacturing method according to claim 18, wherein the lens layer comprises a plurality of lenses, any one of the lenses has a fifth height along a first direction, any one of the lenses has a first width along a second direction, and a ratio of the first width to the fifth height falls in a range of greater than 0.4 and less than 0.7.

20. The manufacturing method according to claim 17, further comprising:

forming a second film layer between the first portion of the reflective structure and the first light-emitting element.

* * * * *